Figure 1:
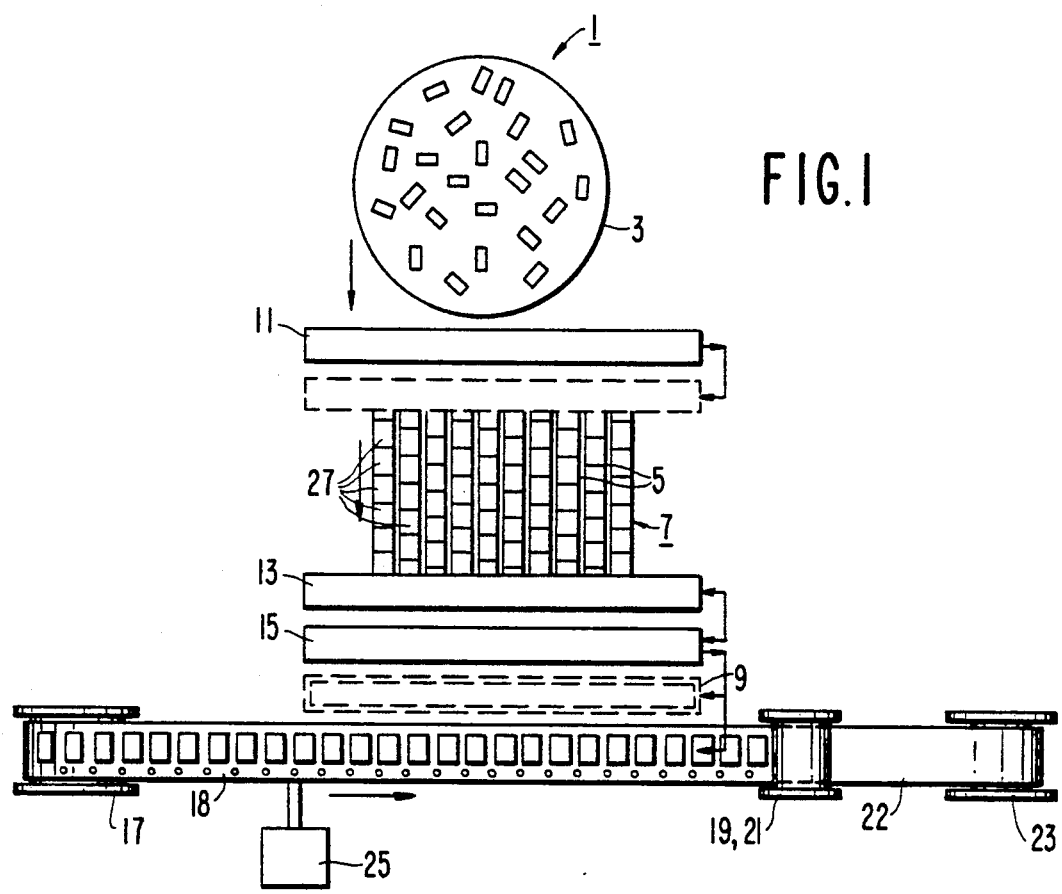

United States Patent [19]
Kemkers et al.

[11] Patent Number: 5,005,338
[45] Date of Patent: Apr. 9, 1991

[54] METHOD OF POSITIONING PRODUCTS ON A TAPE COMPRISING COMPARTMENTS AS WELL AS AN APPARATUS FOR IMPLEMENTING THE METHOD

[75] Inventors: Pieter Kemkers; Johannes H. M. Van Roosmalen; Bernardus G. J. L. Venema, all of Eindhoven, Netherlands

[73] Assignee: U.S. Philips Corporation, New York, N.Y.

[21] Appl. No.: 467,626

[22] Filed: Jan. 19, 1990

Related U.S. Application Data
[63] Continuation-in-part of Ser. No. 309,636, Feb. 9, 1989, abandoned.

[30] Foreign Application Priority Data
Dec. 21, 1988 [NL] Netherlands ............... 8803122

[51] Int. Cl.⁵ .................... B65B 15/04; B65B 57/00
[52] U.S. Cl. ................................. 53/494; 53/54; 53/77; 53/473; 209/573
[58] Field of Search ............ 53/473, 475, 54, 53, 53/55, 493, 495, 494, 77, 444, 148, 534; 209/573, 574; 73/865.8; 324/158 F

[56] References Cited
U.S. PATENT DOCUMENTS

| | | | |
|---|---|---|---|
| 2,997,294 | 8/1961 | Gitzendanner | 209/574 x |
| 3,007,291 | 11/1961 | Jordan et al. | 53/534 X |
| 3,272,331 | 9/1966 | Thiele et al. | 209/74 |
| 3,629,702 | 12/1971 | Henken | 209/573 X |
| 3,738,078 | 6/1973 | Schaaf | 53/54 |
| 4,058,219 | 11/1977 | Quinn | 209/573 X |
| 4,320,339 | 3/1982 | Vancelette | 209/573 X |
| 4,722,169 | 2/1988 | DeSantis | 53/494 |
| 4,905,445 | 3/1990 | Saitoh et al. | 53/54 |

FOREIGN PATENT DOCUMENTS
2061867 11/1980 Fed. Rep. of Germany.

OTHER PUBLICATIONS
IS/MECA brochure—MBM 2000, SOT-23, TMBX-208S, TMBX-2080, THRTR, TMRTR, MELF, TMBZ sp, TMBT, TMBT sot 89, and TMHV (no dates).

Primary Examiner—James F. Coan
Attorney, Agent, or Firm—William Squire

[57] ABSTRACT

Three sets of product pick-up elements each pick up products in a linear array, the three arrays being parallel. One set places products from a vibratory feeder to a buffer array, a second set places product into a measuring station from the buffer and the third set places products onto a packaging tape from the measuring station. Faulty products are individually discharged from the third set. A process is disclosed for filling the intervening empty slots in the tape due to the selective discharge of the faulty products.

15 Claims, 3 Drawing Sheets

METHOD OF POSITIONING PRODUCTS ON A TAPE COMPRISING COMPARTMENTS AS WELL AS AN APPARATUS FOR IMPLEMENTING THE METHOD

This is a continuation-in-part of application Ser. No. 309,636 filed Feb. 9, 1989, now abandoned.

The invention relates to a method of positioning products on a tape comprising product locations, the products being directed and aligned, tested in a row in a measuring station, the tape being transported in a direction of transport and an uninterrupted series of approved products being positioned onto empty locations adjoining occupied compartments of the tape. The invention likewise relates of an apparatus for implementing the method. The products may, for example, be electric components such as SMDs or components comprising connecting wires.

A method of the type to which this invention relates is implemented by means of a commercially available apparatus. According to this method the products are positioned and aligned in a linear buffer of parallel lines, subsequently tested, after which the approved products are placed in a second, linear buffer. On the discharge side of this second linear buffer a row of products is picked up by a set of pick-up elements and tested again. If faulty products are found, all products of the row will be discharged. If no faulty products are found all products will be placed onto a tape comprising locations. Subsequently, the tape is advanced a number of locations equalling the number of pick-up elements in a set of pick-up elements and also equalling the number of products in the set. According to this prior art method, approved products are discharged also, even though only a single product in a row may be faulty.

It is an object of the invention to provide a method of the type set out hereinbefore, according to which with a minimum number of operations all approved products are placed onto the tape and only the faulty products are discharged. According to the invention this object is achieved in that, after the products have been tested, a group of products, i.e. a series of adjoining approved products plus all faulty products that may be present, is picked up, the tape is advanced a number of positions depending on the number of locations already occupied and the series of approved products to be placed, prior to which placing the faulty products are discharged, are placed onto the tape and the vacant positions in the measuring station are filled up.

According to the method of the invention by faulty products are discharged; all approved products are placed on to the tape. Consequently, the efficiency of the method according to the invention will exceed that of the prior art method. In addition, when implementing the method according to the invention, the handling of the products will be greatly reduced with respect to the prior art method.

A further embodiment of the method according to the invention is that a multiple of the pitch of the tape product locations is employed as the pitch for the location of the products to be lifted from the measuring station and placed onto the tape. This is highly advantageous since the pitch of the produced positions in the measuring station need not be reduced if the product dimensions are reduced and an associated reduction occurs in the pitch of the locations of the tape.

In a still further embodiment of the method according to the invention the products are placed into the measuring station by a set of pick-up elements and picked up from the measuring station by a further set of pick-up elements. Thus, the speed at which the tape is filled is enhanced because one set of pick-up elements places the products into the measuring station while the other set discharges the faulty products and inserts the approved products into the tape.

In a further preferred embodiment of the method according to the invention the products are aligned before being placed onto the tape. This alignment takes place just after the products have been tested and just before they are placed onto the tape. This guarantees a proper positioning of the products on the tape.

Yet, in a further embodiment of the method according to the invention, the presence of products is checked and they are inspected for color, orientation and operation. The verification of the presence of products before and inside the measuring station is essential because otherwise there is a risk of product locations in the tape remaining empty. This is intolerable. The products are inspected for color and orientation so as to obtain a uniform presentation of the products on the tape. In the measuring station the operation of the products is checked. In addition to the lacking of products, also the presence of faulty products is intolerable. With these measures it is possible to obtain a tape which is filled to capacity with approved, uniformly oriented products.

For the high-speed and efficient product handling identical movements are made by the sets of pick-up elements in a further embodiment.

The invention also relates to an apparatus for implementing the method.

This apparatus includes a vibratory hopper, a linear buffer comprising parallel lines, a measuring station, pick-up elements, a feeding device for an empty tape, a feeding device for a cover tape, a tape sealing device and a discharge device for the filled, sealed tape, while according to the invention this apparatus is characterized by two sets of pick-up elements, i.e. one set of pick-up elements picking up the products from the linear buffer and placing them into the measuring station and one set of pick-up elements picking up products from the measuring station and subsequently discharging them, if faulty, or placing them onto the tape, if approved, and by a device for advancing the tape.

Owing to these measures a highly compact construction with a single linear buffer is obtained. Between the vibratory hopper and the tape a limited number of products are present. In this way the products are processed very efficiently. The device for advancing the tape can advance the tape one or more locations. The number of locations the tape is advanced depends on the number of approved products that is to be placed on the tape and the number of locations that have already been filled with products. This can be checked and controlled with the aid of software.

It should be observed that the apparatus available on the market comprises two vibratory hoppers, two linear buffers and eight sets of pick-up elements. The two vibratory hoppers place the products into the first linear buffer comprising parallel lines. Four sets of pick-up elements are attached to a first reel. The reel makes a step-wise rotating movement along four operative positions. The products are tested in a first measuring station, and subsequently, the approved products are placed into a second linear buffer comprising parallel lines. This second linear buffer feeds the products to a second reel having four sets of pick-up elements. Also this reel makes a set-wise rotating movement along the four operative positions. The products are again tested in a second measuring station and if a faulty product is found all products will be discharged. Only if all products tested in the measuring station are approved will these products be placed onto a tape.

In this apparatus many products are present between the vibratory hoppers and the tape. This requires some change-over time when changing over to another product because all products are to be removed from the linear buffers.

A preferred embodiment of the apparatus for implementing the method according to the invention is characterized by an aligning station for aligning approved products and for discharging faulty products. Combining two functions in one apparatus enhances the rate at which the tape is filled with products.

A further embodiment of the apparatus for implementing the method according to the invention is characterized by systems for detecting the presence of products and for inspecting the products for color, orientation and operation. These systems enable a tape to be filled to capacity with approved, uniformly oriented products.

Yet another embodiment of the apparatus for implementing the method according to the invention is characterized by a set of pick-up elements for picking up the products from the vibratory hopper and placing them into the linear buffer. In this way several products can simultaneously be placed into the linear buffer.

A still further embodiment of the apparatus for implementing the method according to the invention is characterized by a coupling device coupling the sets of pick-up elements. By means of this coupling device the sets of pick-up elements carry out identical movements.

Figure 2:
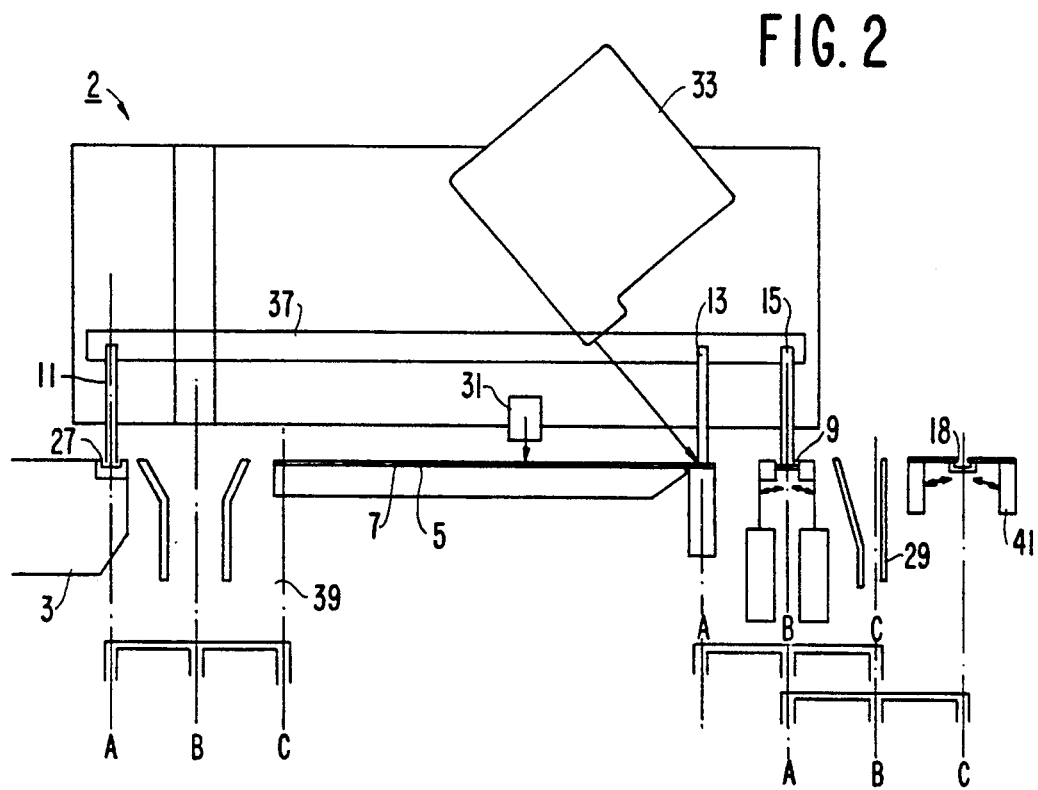
Figure 3:
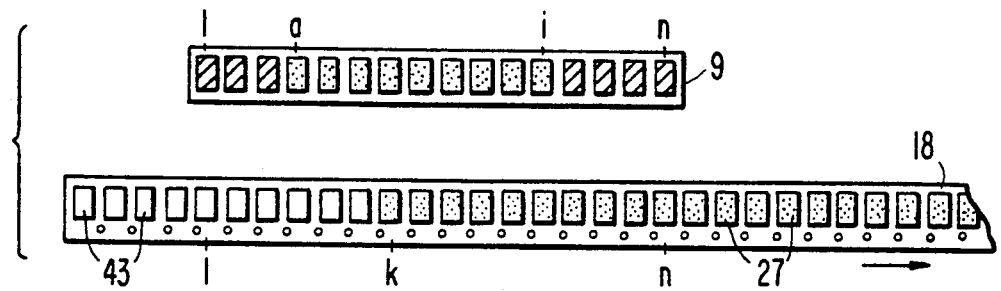
Figure 4:
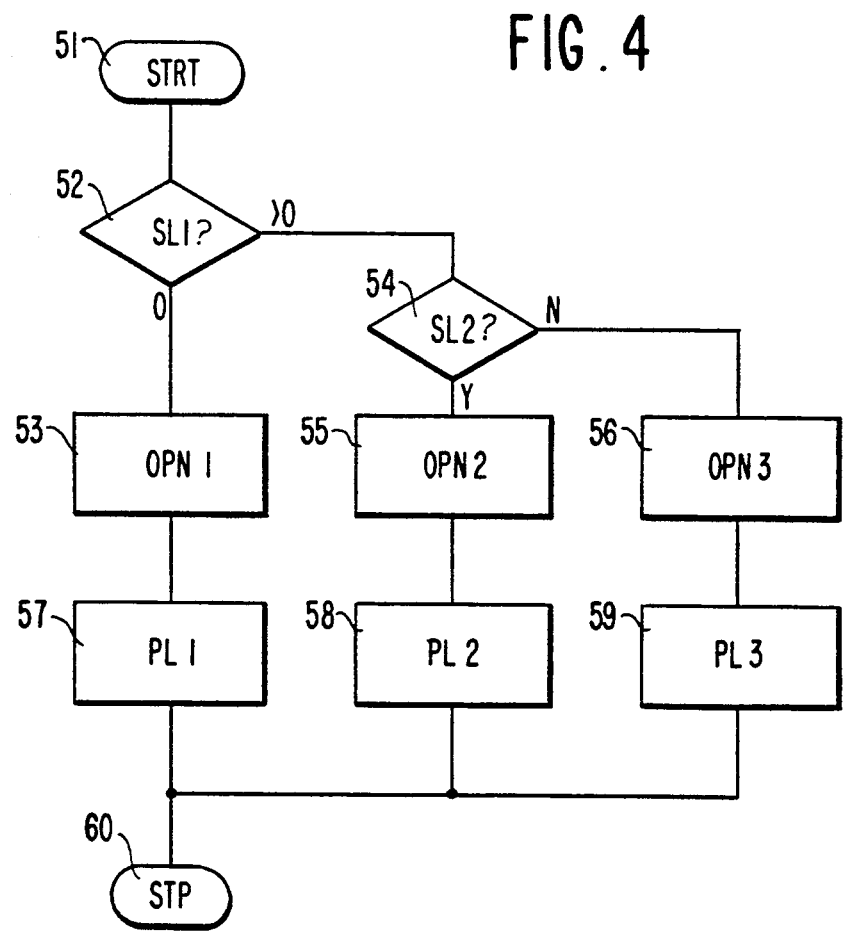

The invention will be further explained with reference to the drawing Figures, in which:

FIG. 1 diagrammatically shows in plan view an embodiment of an apparatus according to the invention;

FIG. 2 diagrammatically shows in side view another embodiment of an apparatus according to the invention;

FIG. 3 diagrammatically shows a measuring station and a tape;

FIG. 4 shows a flow chart of a process according to the invention; and

Figure 5:
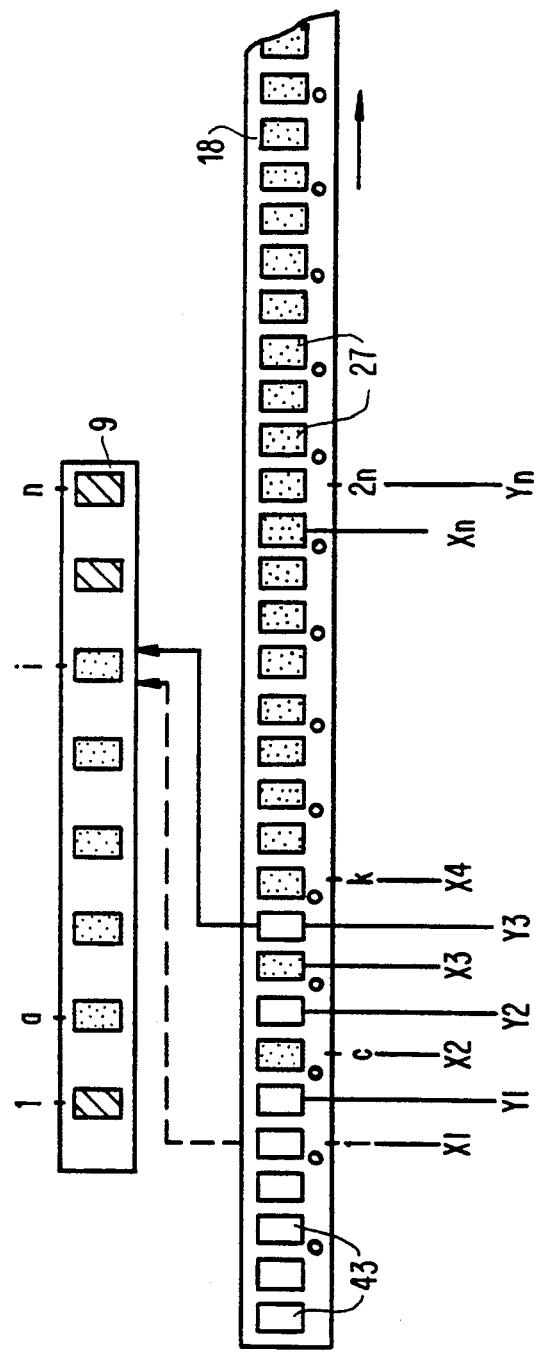

FIG. 5, diagrammatically shows a measuring station and a tape for further explaining the principles of the present invention.

FIG. 1 shows a plan view of an embodiment of an apparatus according to the invention which comprises a vibratory hopper 3, a linear buffer 7 comprising parallel set 5, a measuring station 9, three sets 11, 13, 15 of pick-up elements, a feeding device 17 for an empty tape 18, a feeding device 19 for a cover tape, a sealing device 21 located under the feeding device 19, a discharge device 23 for the filled, sealed tape 22 and a device 25 for advancing the tape. The first set 11 picks up products 27 from the vibratory hopper 3 and places them into the linear buffer 7, the second set 13 picks up products 27 from the linear buffer 7, places them into the measuring station 9 whereas the third set 15 picks up products 27 from the measuring station 9, discharges faulty products an inserts approved ones into the tape 18.

FIG. 2 shows a side view of a further embodiment of an apparatus 2 according to the invention, in which components that are identical with those of FIG. 1 are designated by the same reference characters. In this embodiment are shown an aligning station 29, comprising a device for aligning approved products and discharging faulty ones and also systems 31, 33 for detecting the presence of products 27 and inspecting them for color, orientation and operation. A first system 31 checks which lines 5 of the linear buffer 7 are full. If one or a plurality of lines 5 of the linear buffer 7 are full, the products 27 that were to be placed into the relevant lines 5 will be discharged by the first set 11 of pick-up elements in position B. These discharged products are fed to the vibratory hopper 3. A second system 33 checks whether the products 27 on the linear buffer 7 have the proper orientation. With some products a specific position on the tape may be desirable. This is also checked by the second system 33. In this embodiment the sets 11, 13, 15 are coupled by a coupling device 37 and make an identical movement from A via B to C and then back to A again. The direction of this movement is perpendicular to the direction in which the tape is advanced.

In the measuring station 9 the products 27 are operation-checked. The faulty products are discharge in the aligning station 29 and the approved products are aligned before being placed onto the tape. In position A the first set 11 picks up products 27 from the vibratory hopper 3, the second set 13 picks up products 27 from the Line buffer 7 and the third set 15 picks up products 27 from the measuring station 9. In position B the first set 11 discharges via a discharge chute 39 the products that were to be placed into the full lines 5 of the linear buffer 7, the second set 13 places the picked-up products 27 into the measuring station 9 and the third set 15 places the picked-up products 27 into the aligning station 29 where the faulty products are discharge and the approved products are aligned. In position C the first set 11 places the remaining products 27 into the linear buffer 7, the second set 13 does not handle any products and the third set 15 places the approved products 27 onto the tape 18. At the position where the products 27 are placed onto the tape 18, clamps 41 are installed which are instrumental in inserting the products 27 into the tape 18. A precise explanation of the operation of the apparatus will be given with reference to FIGS. 3, 4 and 5.

In FIG. 3 the product positions in the measuring station 9 are numbered 1 to n, n being the number of positions in the measuring station 9. An apparatus is opted for in which the tape can be advanced in only one direction and a series of approved products is not picked up until the number of approved products in this series is at least equal to half the number of products tested in the measuring station.

The locations of the tape are formed by recessed compartments 43 in which the products are placed. The tape 18 is advanced form position 1 in the direction of position n. the compartments 43 in the tape 18 are numbered 1 to n, compartment 1 being compartment facing position 1 and compartment n facing position n. From the tape compartment 43 facing the measuring station, compartments k to n are filled with the products 27. The different stages in a process implementing the method according to the invention are represented in the flow chart shown in FIG. 4 and hereinafter to be discussed in succession.

51—STRT: The process is started when a row of n products is available in the measuring station. The compartments k to n in the tape are filled at the start of the process.

52—SL1?: Products in the row are tested for faults.

53—OPN1: If there are no faulty products in the row, all products will be picked up from the measuring station and the tape will be advanced n-k+1 locations so that the empty compartment next preceding position k is opposite the nth position of station 9.

54—SL2?: If there are faulty products in the row it will be checked whether there is an uninterrupted series of no less than n/2 products. In FIG. 3, n is 16, so n/2 is 8.

55—OPN2: If there is an uninterrupted series of no less than n/2 approved products, this series of approved products, which are available on positions a to i, with $1 \leq a < i \leq n$ (compare FIG. 3), will be picked up and all faulty products will be picked up as well. The tape will be advanced i-k+1 locations. The empty compartment next preceding position k is thus placed opposite position i of station 9.

56—OPN3: If there is no uninterrupted series of no less than n/2 approved products, only the faulty products will be picked up. The tape will not be advanced.

57—PL1: n products are inserted into the tape and all positions in the measuring station are filled up.

58—PL2: The faulty products are discharged, the series of adjoining approved products is inserted into the tape and the empty positions in the measuring station are filled up.

59—PL3: The faulty products are discharged and the empty positions in the measuring station re filled up.

60—STP: End of the process, n products are available in the measuring station.

When the filling of a tape is commenced, a first series of approved products is not inserted until there is an uninterrupted series of no less than n/2 approved products, one product of which is in position n of the measuring station. This fills the tape to capacity.

With a reduction of the dimensions of the components and the associated reduction of the pitch of the tape compartments the necessary pitch of the positions in the measuring station will at a given moment be larger than the pitch of the compartments. This could be solved by reducing the pitch of the pick-up elements travelling from the measuring station to a position over the tape. However, this calls for a considerable modification of the apparatus. A simpler solution will be described hereinbelow.

In FIG. 5, in a further embodiment, the pitch of the product positions in the measuring station 9 is selected to be twice the pitch, by way of example, of the compartments 27 of the tape 18. The tape 18 is filled with a similar process as described with reference to FIGS. 3 and 4. For this purpose, the compartments of the tape are divided into two fictitious sets of compartments, each set having a pitch corresponding to the pitch of the positions in the measuring station, the compartments of the sets alternating by way of example. The fictitious sets are numbered x1 to xn and y1 to yn, respectively. The tape 18 is filled from compartment k onwards, and in addition, alternate tape compartments x2 and x3 of one set are also filled. When a series of approved products are in positions a to i of the measuring station 9 with $1 \leq a < i \leq n$, the insertion of a series of approved products into the set x1-xn or the set y1-yn can be implemented. In this embodiment, the tape is to be filled to capacity and is advanced in one direction only. In FIG. 5, the tape 18 would be advanced 2i-k+1 positions if the series of approved products a to i were to be inserted, the approved products being placed in the set y1-yn. In this example, i is 6 and k is 7 so that 2i-k+1 is 6. The empty compartment next preceding position k at y3 is placed opposite position i in station 9. In the alternative, the tape would be advanced 2i-c+2 positions if the approved products were to be inserted in a set corresponding to set x1-xn. In this case, position 1 (x1) of the tape is displaced 12 positions to a point opposite position i at station 9. Here i is 6, C is 2 and 2i-c+2=12. In the latter case, however, empty compartments in the tape would occur beyond the position n in the measuring station. These compartments can then no longer be filled. In that case the series of approved products is thus inserted in the row y1-yn.

It should be understood that a number of series of products including faulty products can be picked up by the pick-up elements. The series of approved products are then placed onto the tape one by one, the tape being advanced between the placements of the series of products. It is likewise possible to have the apparatus comprise means for moving the pick-up elements in the direction in which the tape advances. This provides greater flexibility.

Even greater flexibility is obtained with an apparatus in which the tape can be moved in two directions.

We claim:

1. A method of positioning products on a tape having a plurality of product locations, the products being aligned, tested in a row in a measuring station, the tape being transported in a given direction and an uninterrupted series of approved products being positioned onto empty tape locations following occupied locations of the tape, said method comprising:
   advancing the tape a number of positions depending on the number of tape locations already occupied and the number of approved products to be placed;
   discharging only the faulty products; and
   placing the approved products onto the tape, filling the vacant positions in the measuring station.

2. The method as claimed in claim 1, characterized in that said placing step includes lifting products from the measuring station at a pitch which is a multiple of the pitch of the tape product locations.

3. The method as claimed in claim 1 further including the steps of placing the products into the measuring station with a set of pick-up elements, and lifting the products from the measuring station with another set of pick-up elements.

4. The method as claimed in claim 3, characterized in aligning the products before placement onto the tape.

5. The method as claimed in claim 1, further including the step of inspecting for the presence of products, for color, orientation and operation prior to said placing.

6. The method as claimed in claim 3, characterized in the step of moving the pick-up elements identically.

7. The method of claim 1 where in said placing step includes picking up a series of adjoining products, said advancing step advancing the tape according to its number of series approved products.

8. A method of inserting electrical component products into a packaging tape composed of compartments, the products being positioned in parallel lines and aligned, then tested in a row in a measuring station after which a plurality of accepted products is inserted into said tape, said method comprising:

determining the positions of faulty products in said measuring station after testing while in said measuring station;
   picking up the acceptable and faulty products, if any, in the measuring station in accordance with their position in the measuring station;
   discharging only the picked up faulty products; and
   filling the vacant positions in the tape and in the measuring station with approved products.

9. The method of claim 8 wherein said picking up step includes picking up a series of products comprising a row of adjoining accepted products wherein a minimum number in said series is at least about one half the number of products tested in the measuring station, said picking up including picking up the faulty products that may be present, said filling including inserting only the accepted products into empty compartments of the tape after the tape has been advanced.

10. Apparatus for inspecting and positioning products on a tape, said apparatus including a vibratory hopper, a linear buffer comprising parallel lines, a measuring station, pick-up elements, a feeding device for an empty tape, a feeding device for a cover tape, a tape sealing device and a tape discharge device for the filled, sealed tape, the improvement therewith comprising:

one set of first pick-up elements for picking up the products from the linear buffer and placing them into the measuring station; and
   one set of second pick-up elements spaced from the first elements for picking up products from the measuring station and subsequently discharging them, if faulty, or placing them onto the tape, if approved; and
   means for advancing the tape.

11. Apparatus as claimed in claim 10, characterized by an aligning station including means for aligning approved products and for discharging faulty products.

12. Apparatus as claimed in claim 11, further including a means for detecting the presence of products and inspecting them for color, orientation and operation at said measuring station.

13. Apparatus as claimed in claim 10 further including a set of pick-up elements for picking up the products from the vibratory hopper and placing them into the linear buffer.

14. Apparatus as claimed in claim 13 further including a coupling mechanism for coupling the sets of pick-up elements for operation in unison.

15. In an apparatus including a vibratory hopper for feeding products, a linear buffer having parallel lines, a measuring station for distinguishing faulty from acceptable products, product pick-up elements, a feeding device for an empty packaging tape, a feeding device for a cover tape, a tape sealing device and a discharge device for discharging a product filled, sealed packaging tape, the combination therewith comprising:

two sets of product pick-up elements wherein one set of pick-up elements is arranged for picking up products from the linear buffer and placing them into the measuring station and the other set of pick-up elements is arranged for picking up the products from the measuring station and subsequently discharging them, if faulty, and inserting them into the packaging tape, if acceptable; and
   means for advancing the packaging tape.

* * * * *